(12) United States Patent
Cheng et al.

(10) Patent No.: US 9,721,916 B2
(45) Date of Patent: Aug. 1, 2017

(54) CONCENTRIC BUMP DESIGN FOR THE ALIGNMENT IN DIE STACKING

(71) Applicant: Taiwan Semiconductor Manufacturing Company, Ltd., Hsin-Chu (TW)

(72) Inventors: Jung Wei Cheng, Hsin-Chu (TW); Tsung-Ding Wang, Tainan (TW); Chien-Hsun Lee, Chu-tung Town (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/255,963

(22) Filed: Sep. 2, 2016

(65) Prior Publication Data

US 2016/0372436 A1 Dec. 22, 2016

Related U.S. Application Data

(62) Division of application No. 14/179,854, filed on Feb. 13, 2014, now Pat. No. 9,437,551.

(51) Int. Cl.
*H01L 23/00* (2006.01)
*H01L 23/544* (2006.01)
(Continued)

(52) U.S. Cl.
CPC ............ *H01L 24/14* (2013.01); *H01L 21/78* (2013.01); *H01L 23/544* (2013.01); *H01L 24/03* (2013.01); *H01L 24/05* (2013.01); *H01L 24/11* (2013.01); *H01L 24/13* (2013.01); *H01L 24/16* (2013.01); *H01L 24/17* (2013.01); *H01L 24/81* (2013.01); *H01L 25/0657* (2013.01); *H01L 25/50* (2013.01); *H01L 2223/5442* (2013.01); *H01L 2223/54426* (2013.01); *H01L 2223/54486* (2013.01); *H01L 2224/0214* (2013.01); *H01L 2224/0215* (2013.01); *H01L 2224/0345* (2013.01); *H01L 2224/03622* (2013.01);
(Continued)

(58) Field of Classification Search
CPC . H01L 2224/17515; H01L 2224/16106; H01L 2224/16105; H01L 24/81; H01L 2924/0105; H01L 2224/13111; H01L 2224/13099; H01L 24/11; H01L 2224/0401; H01L 2924/00014; H01L 2224/03622; H01L 2224/13014; H01L 2224/14517; H01L 2224/11849; H01L 2224/13026; H01L 2224/03914; H01L 2224/0383; H01L 2924/014; H01L 2224/73253; H01L 2224/81191
See application file for complete search history.

(56) References Cited

U.S. PATENT DOCUMENTS 6,724,095 B2 4/2004 D'Amato et al.
7,135,771 B1 11/2006 Khandekar et al.
(Continued)

*Primary Examiner* — Jasmine Clark
(74) *Attorney, Agent, or Firm* — Slater Matsil, LLP

(57) ABSTRACT

An integrated circuit structure includes an alignment bump and an active electrical connector. The alignment bump includes a first non-solder metallic bump. The first non-solder metallic bump forms a ring encircling an opening therein. The active electrical connector includes a second non-solder metallic bump. A surface of the first non-solder metallic bump and a surface of the second non-solder metallic bump are substantially coplanar with each other.

20 Claims, 16 Drawing Sheets

(51) Int. Cl.
*H01L 21/78* (2006.01)
*H01L 25/065* (2006.01)
*H01L 25/00* (2006.01)

(52) U.S. Cl.
CPC ............ *H01L 2224/03912* (2013.01); *H01L 2224/0401* (2013.01); *H01L 2224/05008* (2013.01); *H01L 2224/05024* (2013.01); *H01L 2224/0558* (2013.01); *H01L 2224/05166* (2013.01); *H01L 2224/05181* (2013.01); *H01L 2224/05186* (2013.01); *H01L 2224/05551* (2013.01); *H01L 2224/05555* (2013.01); *H01L 2224/05569* (2013.01); *H01L 2224/05572* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/0603* (2013.01); *H01L 2224/1147* (2013.01); *H01L 2224/11462* (2013.01); *H01L 2224/11464* (2013.01); *H01L 2224/11849* (2013.01); *H01L 2224/13012* (2013.01); *H01L 2224/13013* (2013.01); *H01L 2224/13014* (2013.01); *H01L 2224/13026* (2013.01); *H01L 2224/13082* (2013.01); *H01L 2224/13083* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13562* (2013.01); *H01L 2224/13639* (2013.01); *H01L 2224/13644* (2013.01); *H01L 2224/13655* (2013.01); *H01L 2224/13664* (2013.01); *H01L 2224/1403* (2013.01); *H01L 2224/14051* (2013.01); *H01L 2224/14104* (2013.01); *H01L 2224/14134* (2013.01); *H01L 2224/14179* (2013.01); *H01L 2224/14517* (2013.01); *H01L 2224/16058* (2013.01); *H01L 2224/16059* (2013.01); *H01L 2224/16238* (2013.01); *H01L 2224/17051* (2013.01); *H01L 2224/17515* (2013.01); *H01L 2224/17517* (2013.01); *H01L 2224/81139* (2013.01); *H01L 2224/81141* (2013.01); *H01L 2224/81193* (2013.01); *H01L 2224/81194* (2013.01); *H01L 2224/81815* (2013.01); *H01L 2224/94* (2013.01); *H01L 2225/06513* (2013.01); *H01L 2225/06593* (2013.01); *H01L 2924/014* (2013.01); *H01L 2924/01022* (2013.01); *H01L 2924/01073* (2013.01); *H01L 2924/04941* (2013.01); *H01L 2924/04953* (2013.01)

(56) References Cited

U.S. PATENT DOCUMENTS

| | | |
|---|---|---|
| 7,332,423 B2 | 2/2008 | Starkston et al. |
| 2004/0253801 A1 | 12/2004 | Lin |
| 2012/0161312 A1* | 6/2012 | Hossain ............ H01L 23/49816 257/737 |
| 2013/0256878 A1 | 10/2013 | Hsu et al. |
| 2014/0256126 A1* | 9/2014 | Wang ..................... H01L 24/13 438/613 |

* cited by examiner

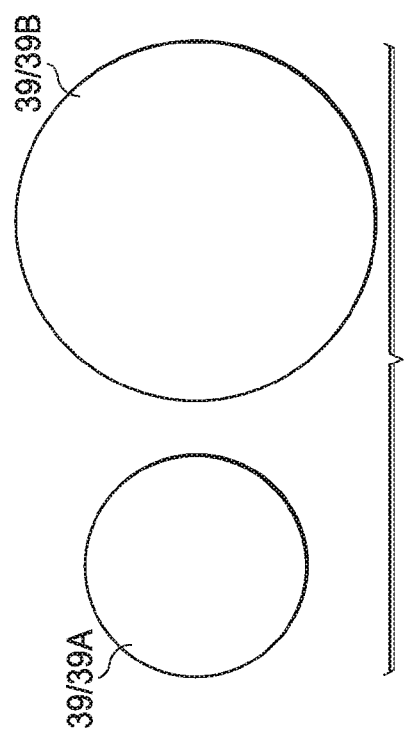
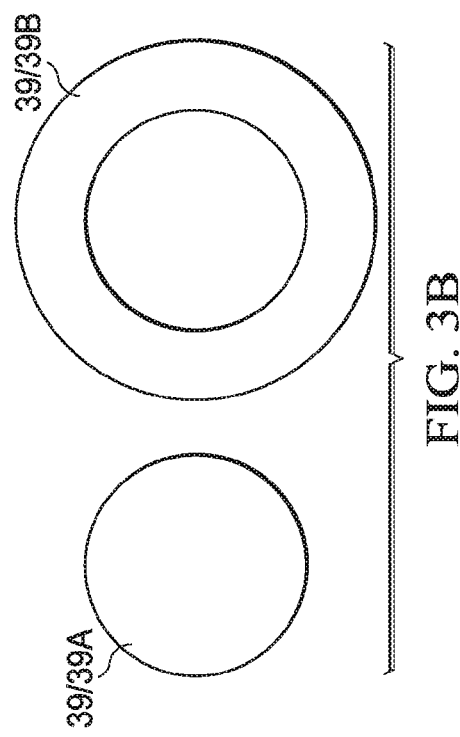

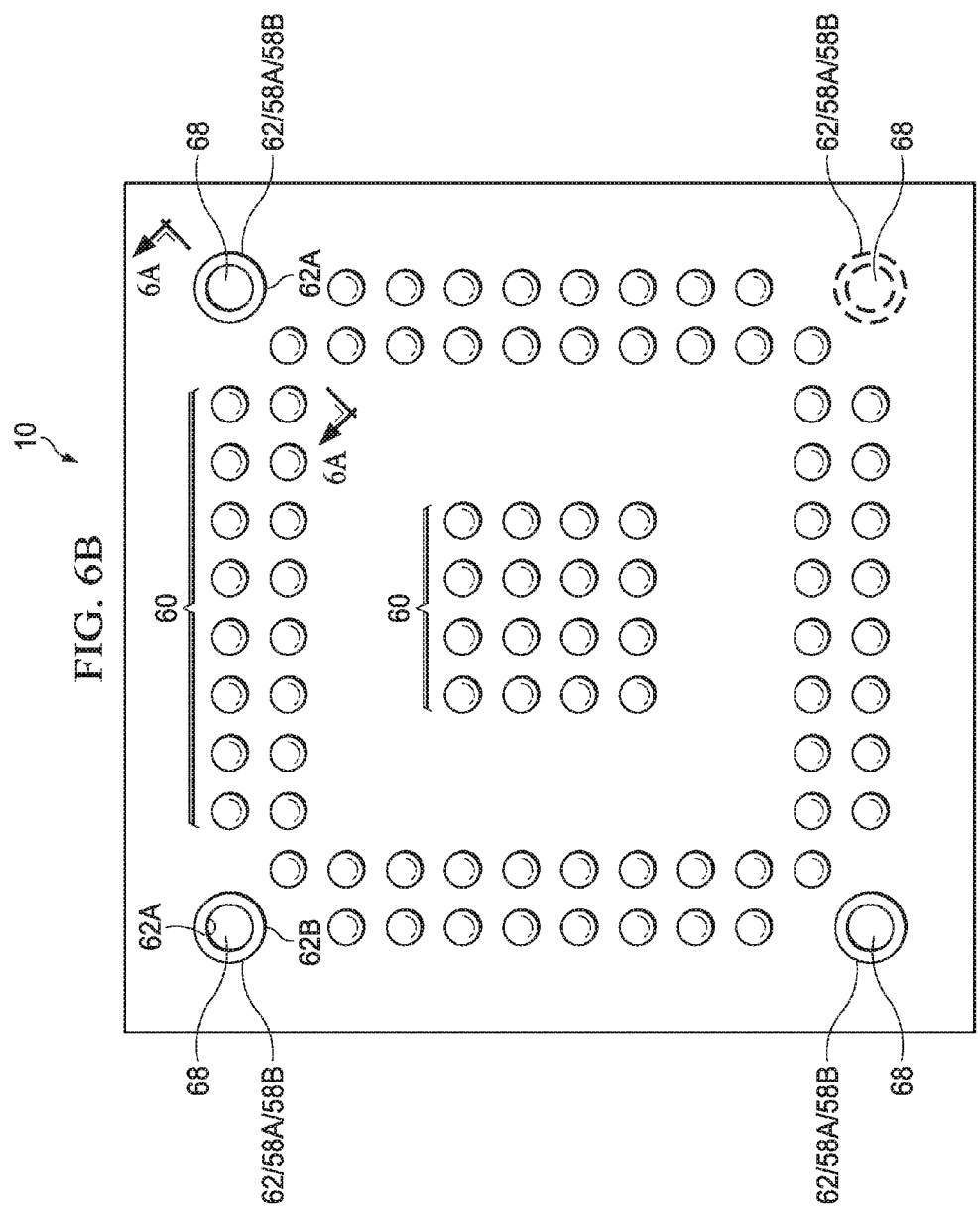

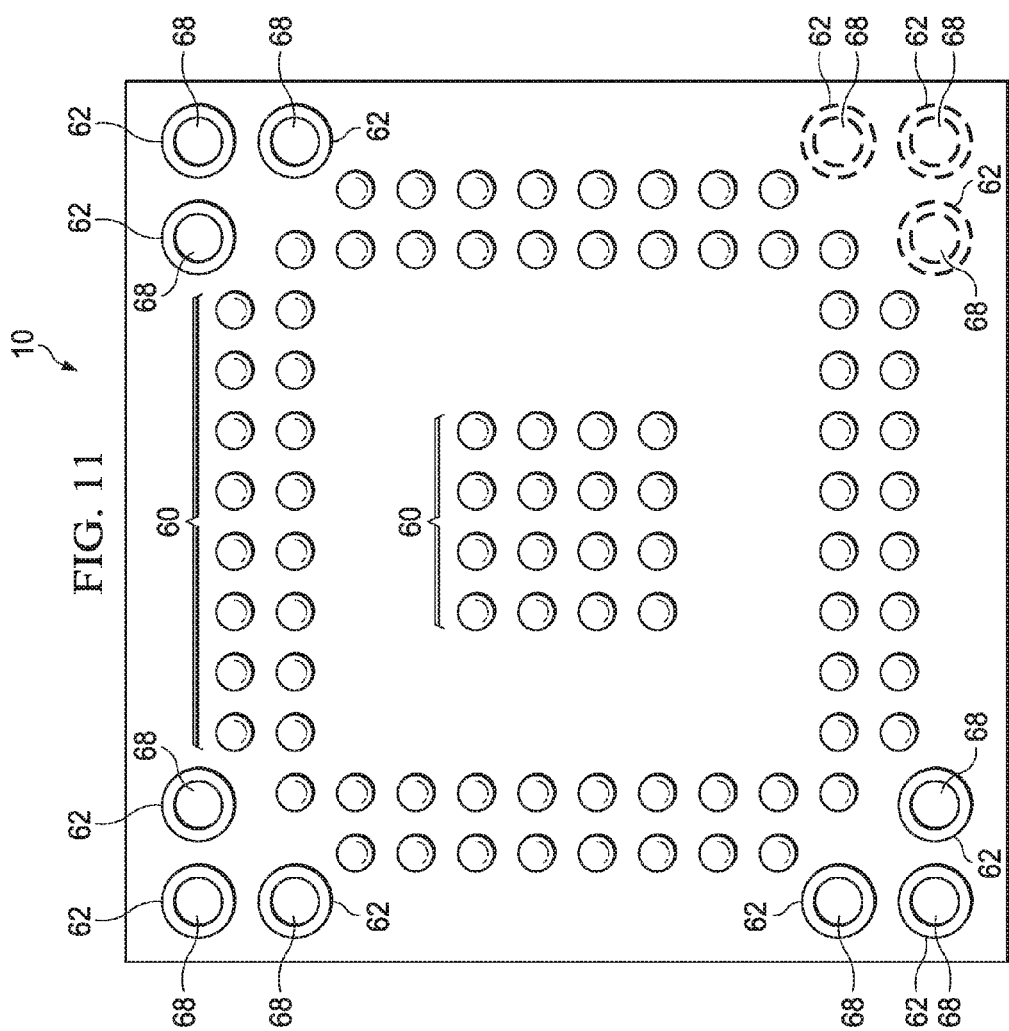

CONCENTRIC BUMP DESIGN FOR THE ALIGNMENT IN DIE STACKING

PRIORITY CLAIM AND CROSS-REFERENCE

This application is a divisional of U.S. patent application Ser. No. 14/179,854, now U.S. Pat. No. 9,437,551, entitled "Concentric Bump Design for the Alignment in Die Stacking," filed on Feb. 13, 2014, which application is incorporated herein by reference.

BACKGROUND

Stacked dies are commonly used in Three-Dimensional (3-D) integrated circuits. Through the stacking of dies, the footprints of packages are reduced. In addition, the metal line routing in the dies is significantly simplified through the formation of stacked dies.

In some applications, a plurality of stacked dies is stacked to form a die stack. The total count of the stacked dies may sometimes reach eight or more. When such a die stack is formed, a first die is first bonded onto a package substrate through flip-chip bonding, wherein solder regions/balls are reflowed to join the first die to the package substrate. A first underfill is dispensed into the gap between the first die and the package substrate. The first underfill is then cured. A test is then performed to ensure that the first die is connected to the package substrate correctly, and the first die and the package substrate function as desired.

Next, a second die is bonded onto the first die through flip-chip bonding, wherein solder regions/balls are reflowed to join the second die to the first die. A second underfill is dispensed into the gap between the second die and the first die. The second underfill is then cured. A test is then performed to ensure that the second die is connected to the first die and the package substrate correctly, and the first die, the second die, and the package substrate function as desired. Next, a third die is bonded onto the second die through the same process steps as for bonding the first die and the second die. The processes are repeated until all the dies are bonded.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 6A illustrate the cross-sectional views and top views of intermediate stages in the formation of a package component in accordance with some embodiments;

FIG. 6B illustrates a top view of a package component in accordance with some embodiments;

FIG. 11 illustrates a top view of a package component in accordance with some alternative embodiments, wherein a plurality of alignment bumps is formed at one corner of the package component.

DETAILED DESCRIPTION

Figure 1:
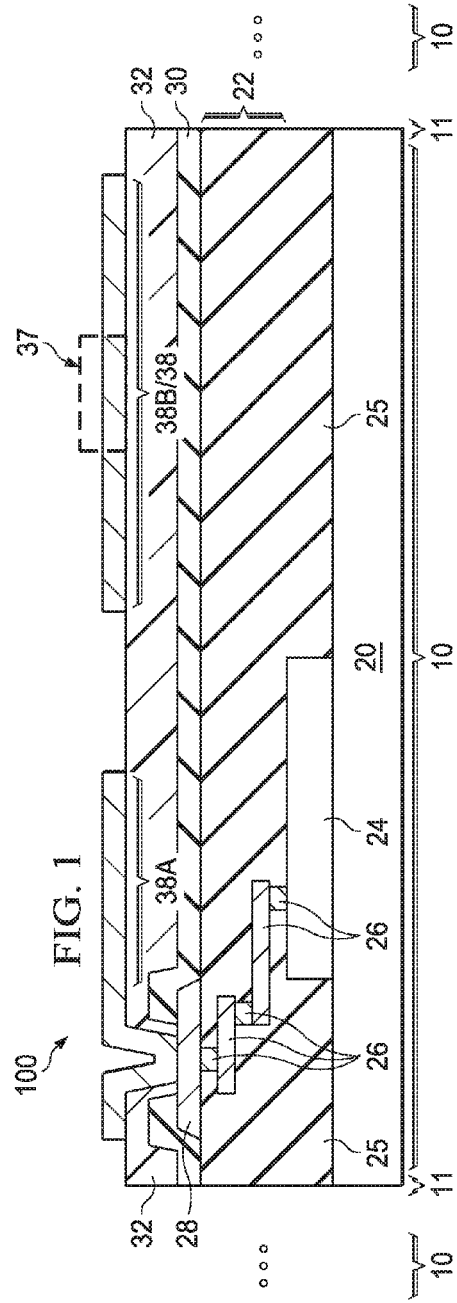

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including alignment bumps and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

FIGS. 1 through 6B illustrate the cross-sectional views and top views in the formation of a die including electrical connectors and alignment bumps in accordance with some embodiments. It is appreciated that although a wafer and a device chip is referred to in the exemplary embodiments, the electrical connectors and the alignment bumps may also be formed in any other package components including, and not limited to, package substrates, interposers, and packages (such as fan-out packages).

FIG. 1 illustrates the cross-sectional view of wafer 100 in accordance with some embodiments. Wafer 100 includes a plurality of chips 10 therein, with scribe lines 11 separating chips 10 from each other. Wafer 100 (and each of chips 10) includes substrate 20, which may be a semiconductor substrate, such as a silicon substrate. Semiconductor substrate 20 may also be formed of other semiconductor materials such as silicon germanium, silicon carbon, a III-V compound semiconductor, or the like. Active devices 24 such as transistors are formed at the surface of substrate 20. Interconnect structure 22 is formed over substrate 20. Interconnect structure 22 includes metal lines and vias 26 electrically coupled to the semiconductor devices 24. Metal lines and vias 26 are formed in low-k dielectric layers 25, which may be extreme (or extra) low-k (ELK) dielectric layers that have dielectric constants lower than 2.5, or lower than about 2.0.

Metal pad 28 is formed over interconnect structure 22. Metal pad 28 may comprise aluminum, copper, aluminum copper, silver, gold, nickel, tungsten, alloys thereof, and/or multi-layers thereof. It is appreciated that although one metal pad 28 is illustrated in each of chips 10, a plurality of metal pads 28 exists in the same chip 10. Metal pad 28 may be electrically coupled to semiconductor devices 24, for example, through the underlying interconnect structure 22. Passivation layer 30 and polymer layer 32 cover the edge portions of metal pad 28. In some exemplary embodiments, passivation layer 30 is formed of dielectric materials such as silicon oxide, silicon nitride, or multi-layers thereof. An Opening is formed in passivation layer 30 and polymer layer 32 to expose metal pad 28.

Polymer layer 32 is over passivation layer 30, wherein polymer layer 32 extends into the openings in passivation layer 30. Polymer layer 32 may include a photo-sensitive material in accordance with some embodiments. For example, the material of polymer layer 32 may be selected from, and is not limited to, polyimide, polybenzoxazole (PBO), and the like. Polymer layer 32 is also patterned to form additional openings, so that metal pads 28 are exposed.

Post-Passivation Interconnects (PPIs) 38 (including 38A and 38B) are formed. PPIs 38 include some portions over polymer layer 32, and some other portions extending into the opening in passivation layer 30 and polymer layer 32 to contact metal pad 28. PPI 38 includes PPI pad 38A, wherein PPI pad 38A is an integral portions of PPIs 38 that is wider than other portions. PPI pad 38A is electrically coupled to metal pad 28 through the trace portion of PPI 38, wherein the trace portion extends into an opening in passivation layer 30 and polymer layer 32 to contact metal pad 28.

In some embodiments, PPIs 38 further include PPI pad 38B. The top view of PPI pads 38A and 38B may have circular shapes, squares, hexagon shapes, octagon shapes, or any other applicable shapes. In alternative embodiments, PPI pad 38B is not formed.

In some embodiments, PPI pad 38B is a dummy pad that is not electrically connected to any of underlying metal pads, semiconductor devices, and metal lines and vias. PPI pad 38B thus may not have electrical functions in the result package. In alternative embodiments, as illustrated by dashed lines in FIG. 8A, PPI pad 38B may also be electrically connected to the underlying metal pad, metal lines and vias, and/or semiconductor devices 24, and hence PPI pad 38B may also be an active metal pad that has electrical functions in the resulting package.

In the top view of wafer 100, PPI pad 38B may appear to be a solid pad with no opening therein. Alternatively, PPI pad 38B may also have an opening therein, as illustrated by dashed line 37, wherein the portion of PPI pad 38B in the region defined by dashed line 37 is not formed, and hence PPI pad 38B encircles the opening.

Figure 2:
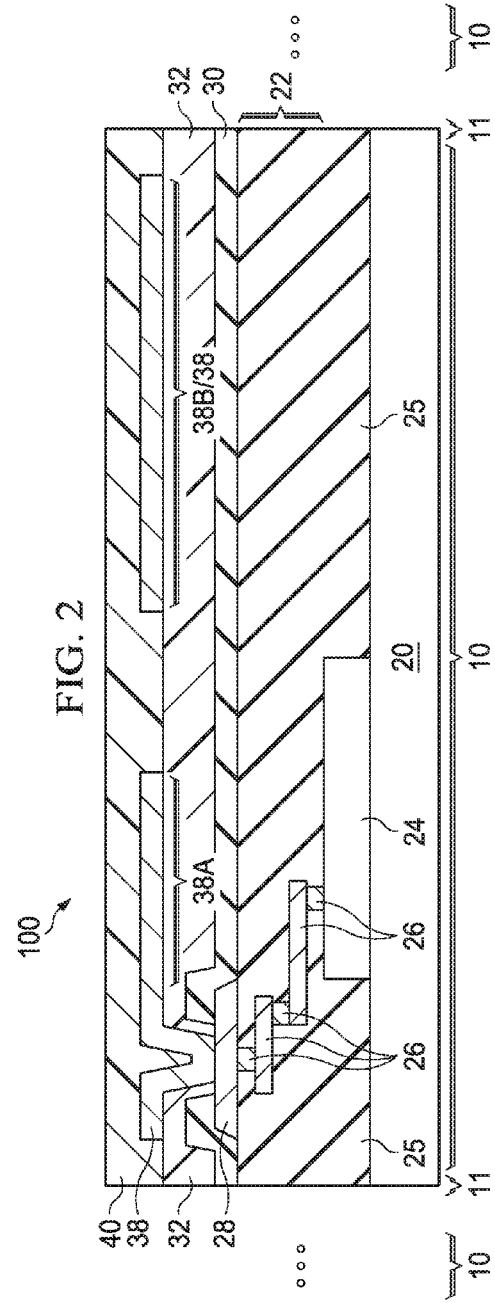
Figure 3A:
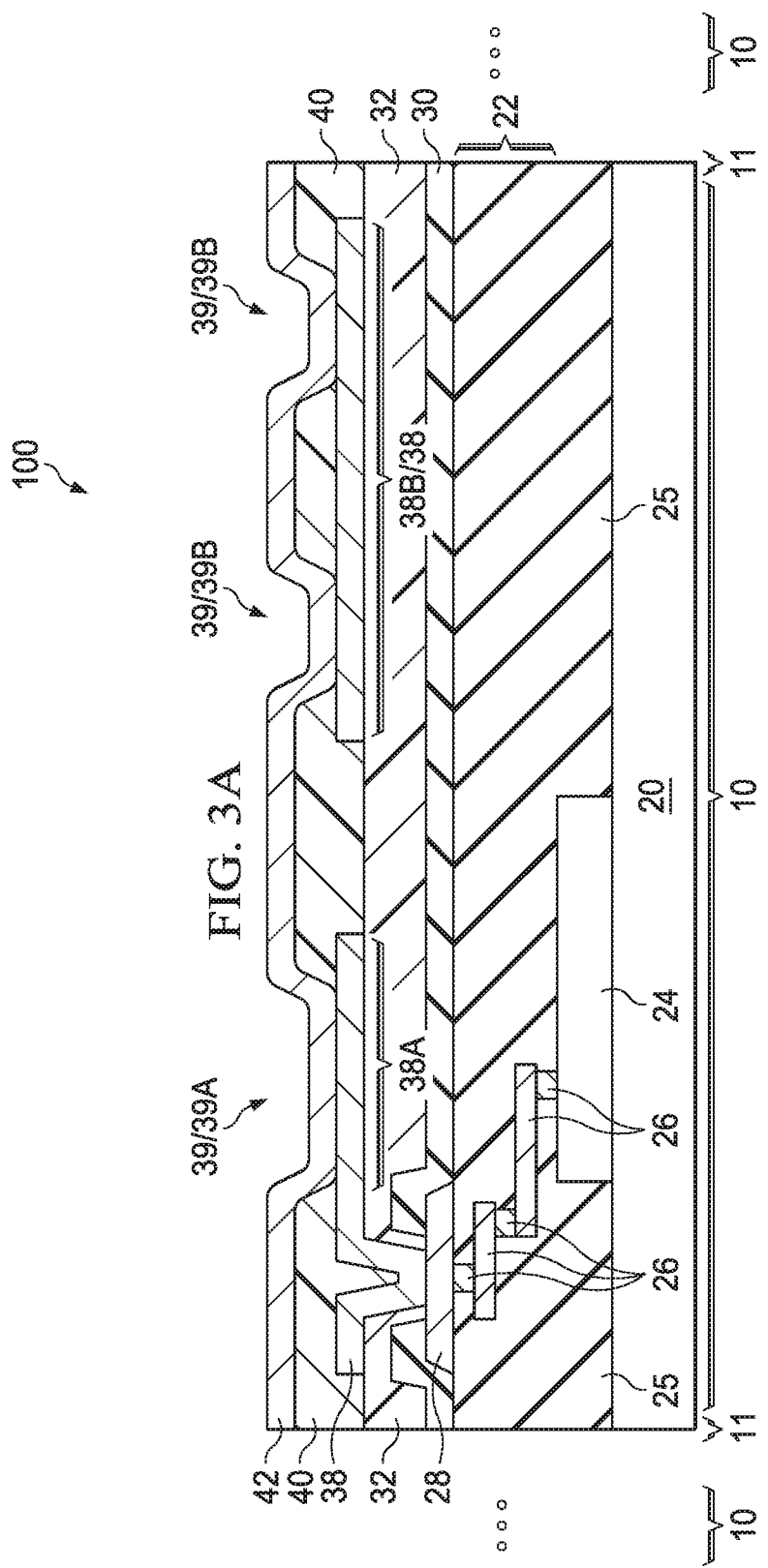

Referring to FIG. 2, polymer layer 40 is further formed over PPIs 38. Polymer layer 40 may be formed of a material selected from the same candidate materials of polymer layer 32. Next, as shown in FIG. 3A, openings 39 (including 39A and 39B) are formed in polymer layer 40 to expose PPI pads 38A and 38B. Opening 39A overlaps metal pad 38A, with metal pad 38A exposed through opening 39A. In some embodiments, opening 39B overlaps metal pad 38B, and hence metal pad 38B is exposed through opening 39B. In alternative embodiments, opening 39B is not formed, and the subsequently formed alignment bump 62 (FIG. 6A) sits on polymer layer 40 directly without connected to any underlying PPI pad. In these embodiments, PPI pad 38B is not formed.

Exemplary top-view shapes of openings 39A and 39B are illustrated in FIG. 3B, in which opening 39B forms a ring. In alternative embodiments, openings 39A and 39B have the shapes as shown in FIG. 3C, in which opening 39B is also a continuous circular opening.

Next, as also shown in FIG. 3A, Under-bump metallurgies (UBM) layer 42 is formed over polymer layer 40, wherein UBM layer 42 extends into openings 39 to contact PPI pads 38A and 38B. In some embodiments, UBM layer 42 includes a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or copper alloys, and hence the seed layer is alternatively referred to as a copper seed layer hereinafter. However, other metals such as silver, gold, aluminum, palladium, nickel, nickel alloys, tungsten alloys, chromium, chromium alloys, and combinations thereof may also be included. In some embodiments, UBM layer 42 is formed using Physical Vapor Deposition (PVD) or other applicable methods.

Figure 4:
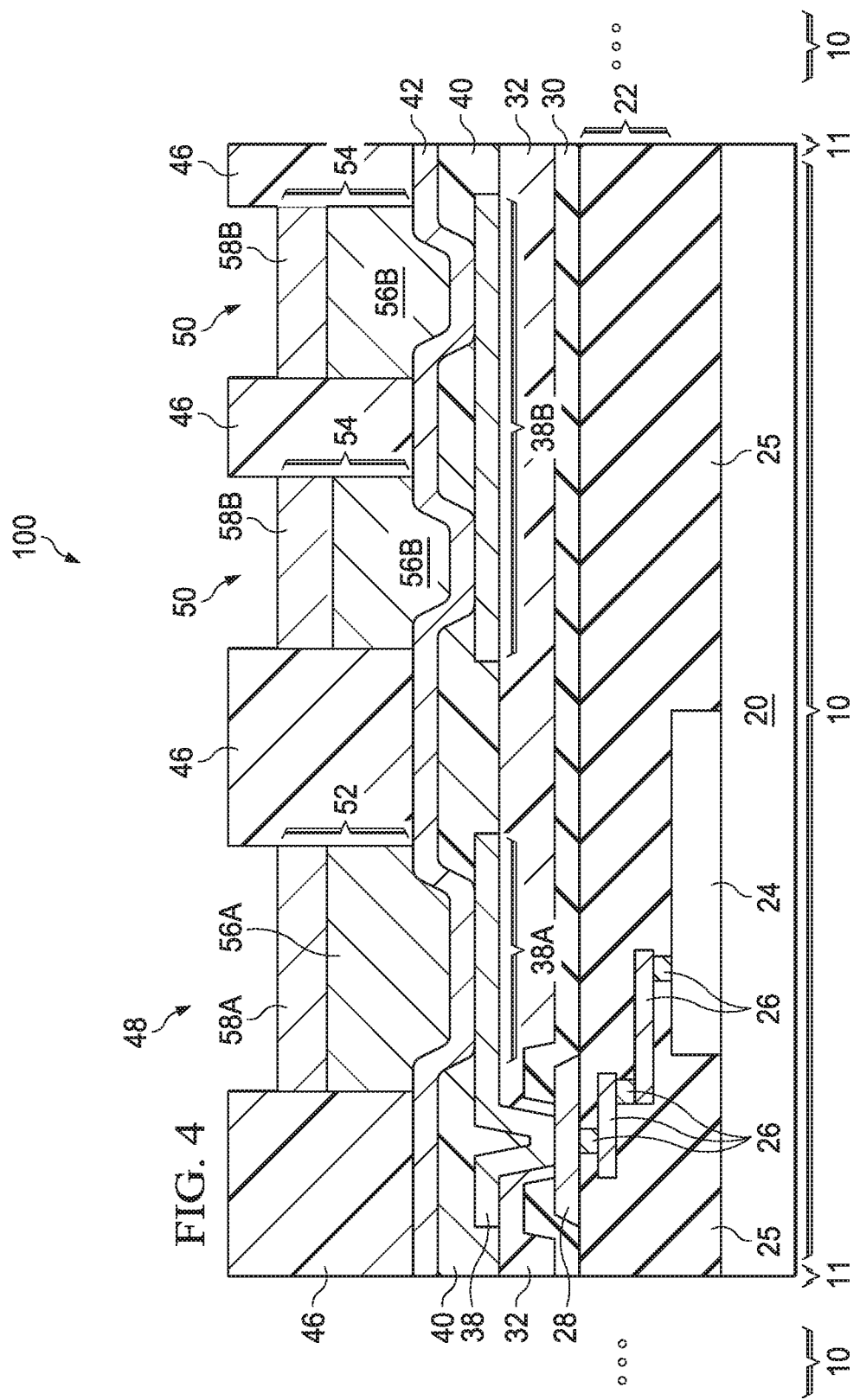
Figure 5:
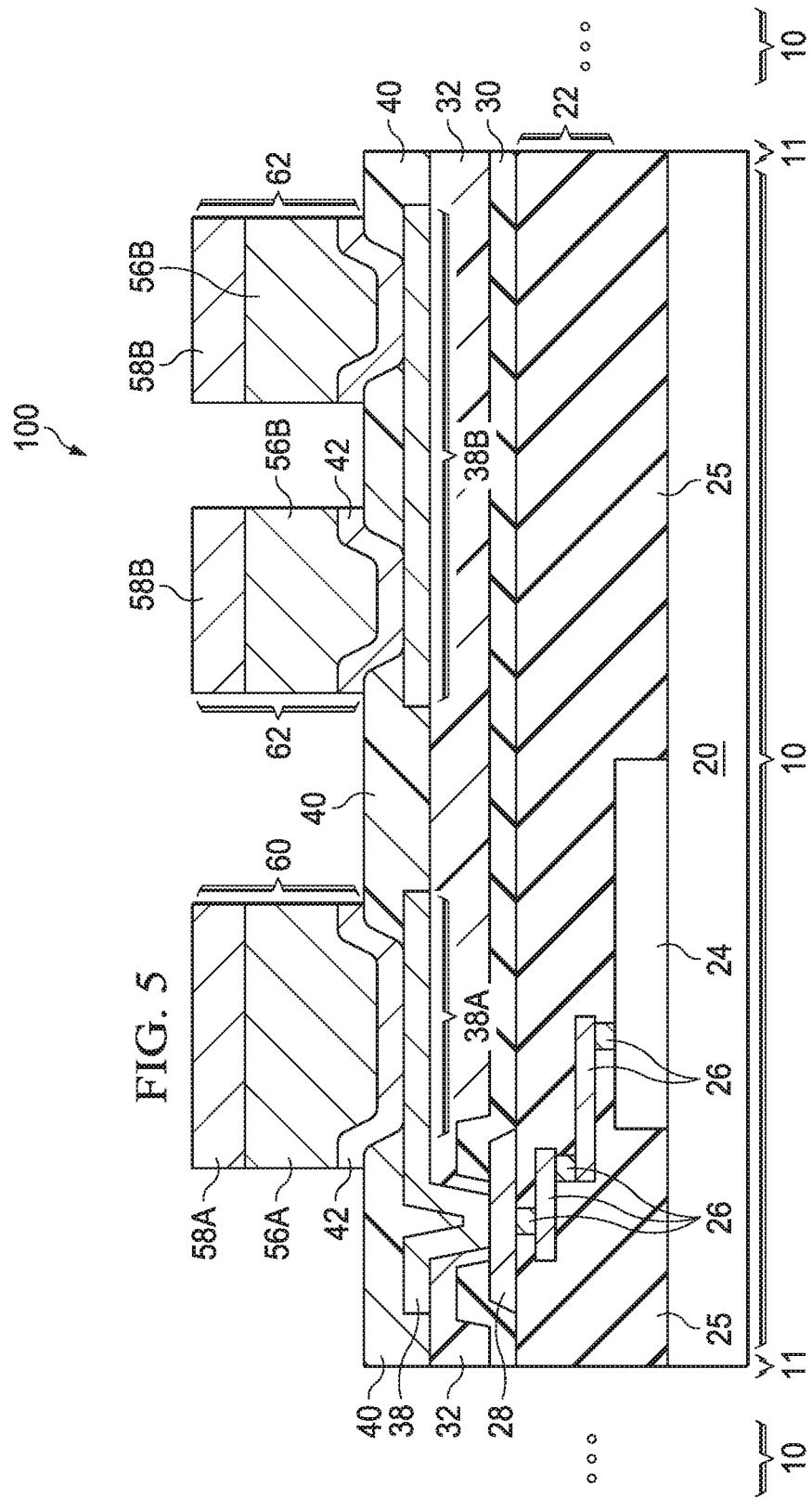

FIG. 4 illustrates the formation of mask 46, which may be formed of a photo resist or a dry film that is laminated on UBM layer 42, for example. Mask 46 is patterned, and some portions of UBM layer 42 are exposed through openings 48 and 50 in mask 46, while other portions of UBM layer 42 are covered by mask 46. Opening 48 is directly over PPI pad 38A. Opening 50 is directly over PPI pad 38B.

In the embodiments as shown in FIG. 4, UBM layer 42 is connected to the underlying PPI pad 38B. In alternative embodiments, opening 50 and PPI pad 38B are not formed. Accordingly, the portion of UBM layer 42 that is exposed through opening 50 sits on polymer layer 40 without being connected to any underlying PPI pad.

Next, as also shown in FIG. 4, electrical connector 52 and alignment bump 54 are formed. In some embodiments, wafer 100 is placed into a plating solution (not shown), and a plating step is performed to form electrical connector 52 and alignment bump 54 on UBM layer 42. Electrical connector 52 and alignment bump 54 are formed in openings 48 and 50, respectively. The plating may be an electro-plating, an electroless-plating, an immersion plating, or the like. In some exemplary embodiments, electrical connector 52 and alignment bump 54 comprise non-solder parts 56A and 56B, respectively, which are not molten in the subsequent reflow processes. The non-solder parts 56A and 56B may be formed of copper, and hence are referred to as copper bumps 56A and 56B hereinafter, although they may be formed of other non-solder materials. The top surfaces of copper bumps 56A and 56B are substantially coplanar with each other, for example, with a height difference smaller than about 6 μm. Electrical connector 52 and alignment bump 54 may also include cap layer(s) (not shown) selected from a nickel layer, a nickel alloy, a palladium layer, a gold layer, a silver layer, and multi-layers thereof. The cap layer(s) are formed over copper bumps 56A and 56B. Electrical connector 52 and alignment bump 54 further include solder caps 58A and 58B, respectively, which may be formed of a Sn—Ag alloy, a Sn—Cu alloy, a Sn—Ag—Cu alloy, or the like, and may be lead-free or lead-containing.

Figure 6A:
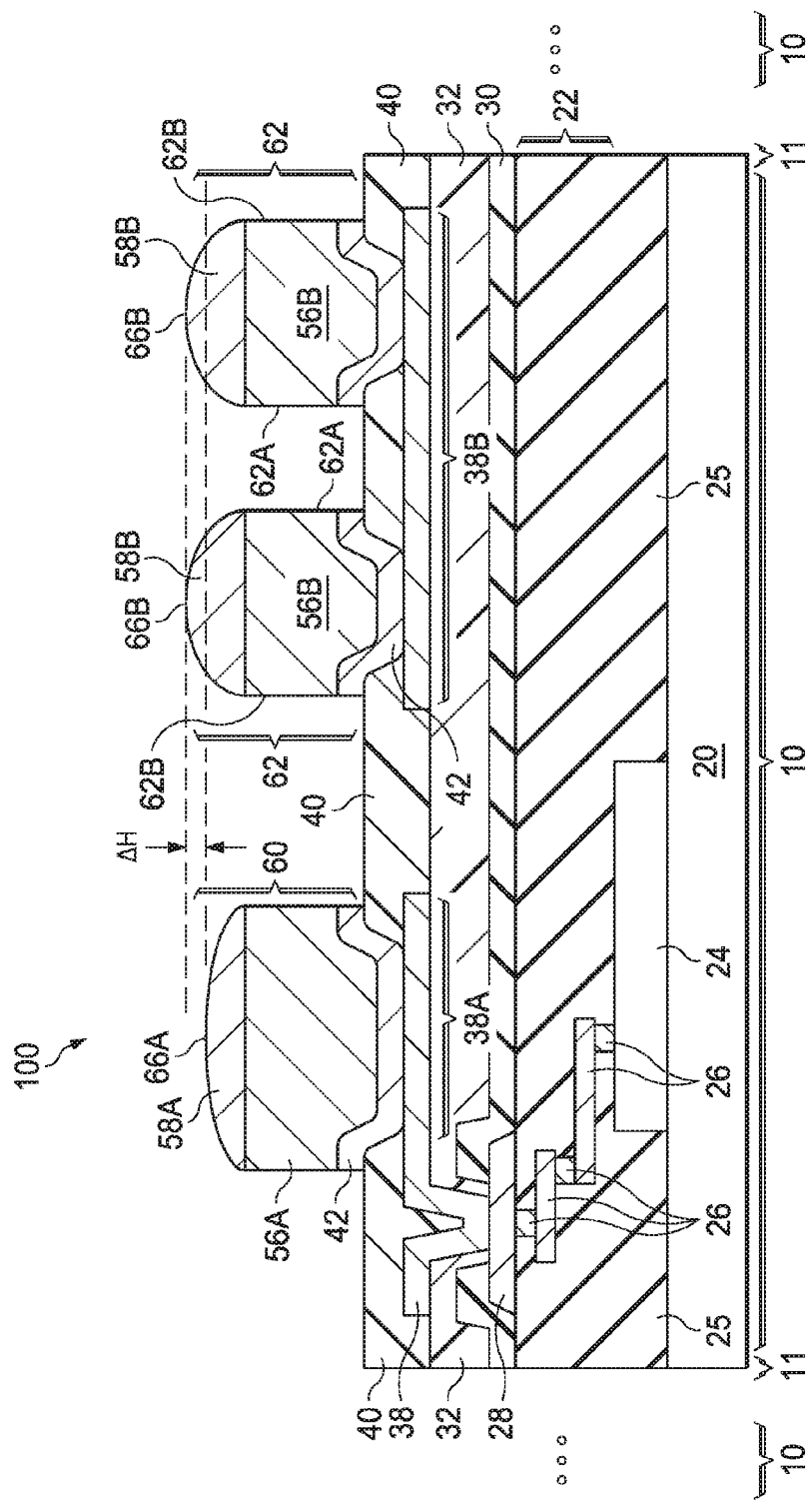

After the formation of electrical connector 52 and alignment bump 54, mask 46 is removed, and the portions of UBM layer 42 that are previously covered by mask 46 are exposed. An etching step is them performed to remove the portions of UBM layer 42 that are not covered by metal bumps (such as electrical connector 52 and alignment bump 54). In the resulting structure, a remaining UBM portion and the overlying electrical connectors 52 in combination are referred to as electrical connector 60 as shown in FIG. 6A, and a remaining UBM portion and the overlying metal bump 52 in combination are referred to as alignment bump 62 (FIG. 6A). Electrical connector 60 is electrically coupled to metal pad 28. Alignment bump 62 may not have the function of electrically connecting to the devices 24 in wafer 100, and hence may be a dummy bump.

Referring to FIG. 6A, a reflow is preformed to reflow solder caps 58A and 58B. As a result, solder caps 58A and 58B have rounded top surfaces. In some embodiments, the top end 66A of electrical connector 60 is lower than top ends 66B of alignment bump 62, with height difference $\Delta H$ being greater than about 6 μm, for example. This may be achieved by making the top-view sizes of alignment bump 62 to be greater than the top-view sizes of electrical connector 60. With appropriate sizes selected, the reflowed electrical connector 60 will have its top end 66A lower than the top ends 66B of the reflowed alignment bump 62. After the reflow, wafer 100 is sawed apart into discrete chips 10 (referred to as dies hereinafter) in a die-saw process, wherein the die-saw is performed by cutting through scribe lines 11.

FIG. 6B illustrates an exemplary top view of die 10, wherein the cross-sectional view illustrated in FIG. 6A is obtained from the plane containing line 6A-6A in FIG. 6B. A plurality of electrical connectors 60 is distributed throughout the surface of die 10. At least three alignment bumps 62 that are not aligned to a straight line are distributed on the surface of die 10. In some embodiments, more than three, such as four, alignment bumps 62 are disposed on the surface of die 10. For example, as shown in FIG. 6B, four alignment bumps 62 are formed, each located in one corner region of die 10. Alignment bumps 62 may be distributed to the exclusion region of chips, wherein the exclusion regions are the regions that electrical connectors 60 are not to be formed in. For example, if electrical connectors 60 are disposed in the exclusion regions, they suffer from high stress, and the reliability of the electrical connection is compromised. Since dummy alignment bumps 62 are used to prevent the shifting of bumps, and they do not have electrical functions, they may be distributed to the corner regions. Alignment bumps 62 may also be distributed to other parts of die 10 other than the corner regions, wherein the other parts include edge regions and inner regions that are surrounded by edge regions and corner regions.

As shown in FIG. 6B, each of alignment bumps 62 includes copper bump 56B and solder layer 58B, which encircle opening 68 therein. Opening 68 is also illustrated in FIG. 6A. In some embodiments, as shown in FIG. 6B, alignment bump 62 includes inner sidewall 62A facing opening 68, and outer sidewall 62B opposite to inner sidewall 62A. Inner sidewall 62A and outer sidewall 62B form rings, which may be concentric in some embodiments. In alternative embodiments, inner sidewall 62A and outer sidewall 62B are not concentric.

Figure 7:
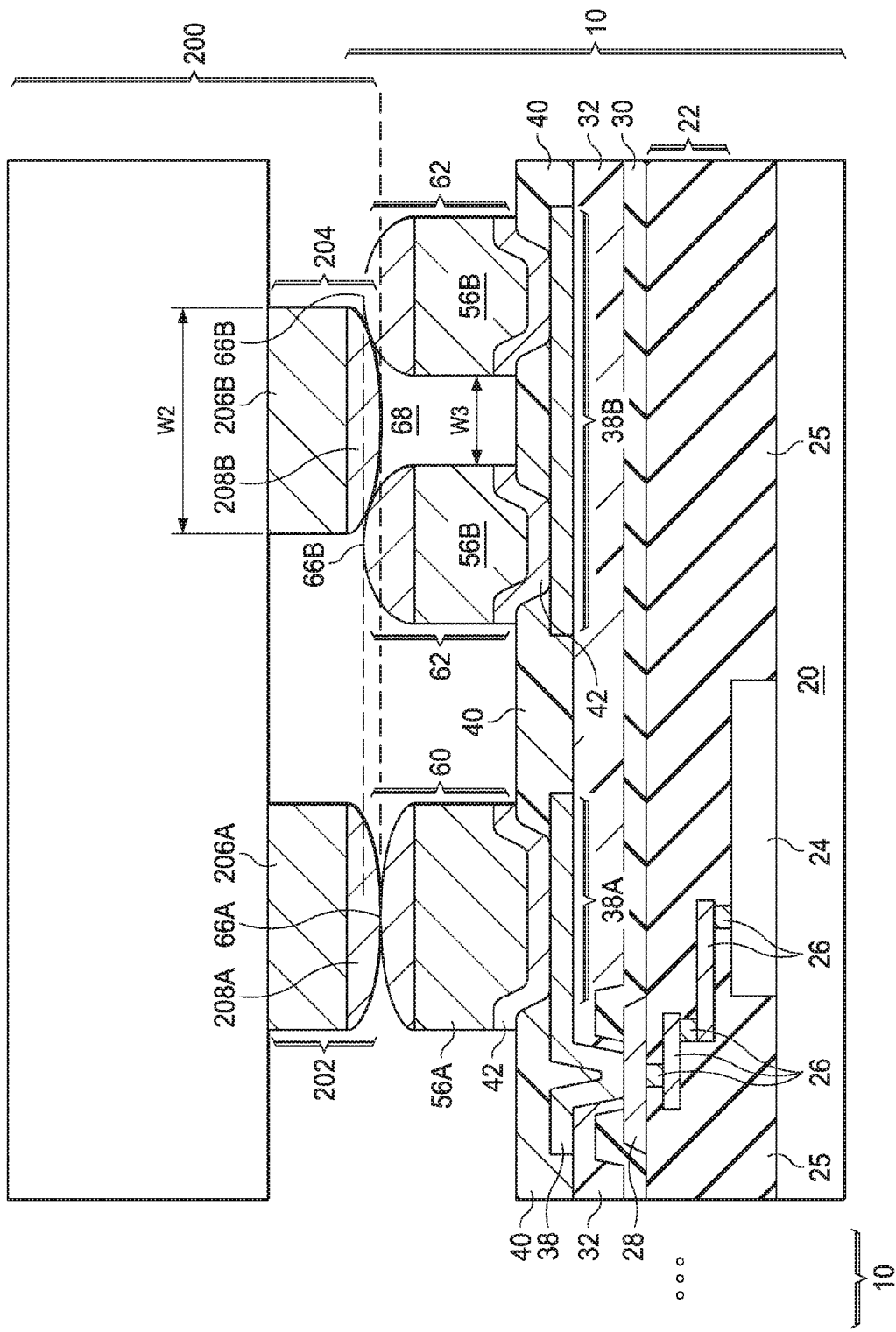
FIG. 7 illustrates the cross-sectional view in the bonding of two package components in accordance with some embodiments.

Next, referring to FIG. 7, package component 200 is placed over die 10. Package component 200 may be a device die, a package substrate, an interposer, a package, or the like. Package component 200 includes electrical connector 202 and bump 204 at the surface of package component 200. In some embodiments, electrical connector 202 include non-solder bump 206A and solder layer 208A, and bump 204 includes non-solder bump 206B and solder layer 208B.

Bump 204 may be a dummy bump that has no electrical function, or may be an active electrical connector that has electrical functions, for example, interconnecting the devices in package component 200 and die 10. Electrical connector 202 and bump 204 may have the same size, and may be formed simultaneously using the same process steps.

Electrical connector 202 is aligned to, and is put in physical contact with electrical connector 60. Bump 204 is aligned to opening 68 of alignment bump 62. Width W2 of non-solder bump 206B may be greater than, equal to, or smaller than, width W3 of opening 68, Since the top ends 66B of alignment bump 62 are higher than top end 66A of electrical connector 60, bump 204 extends below top ends 66B and into opening 68. Accordingly, alignment bump 62 has the function of aligning die 10 and package component 200 with each other, and preventing package component 200 from shifting relative to die 10. For example, when package component 200 shifts, the shifting of the bottom part of bump 204 will be blocked by the top part of alignment bump 62.

Figure 8A:
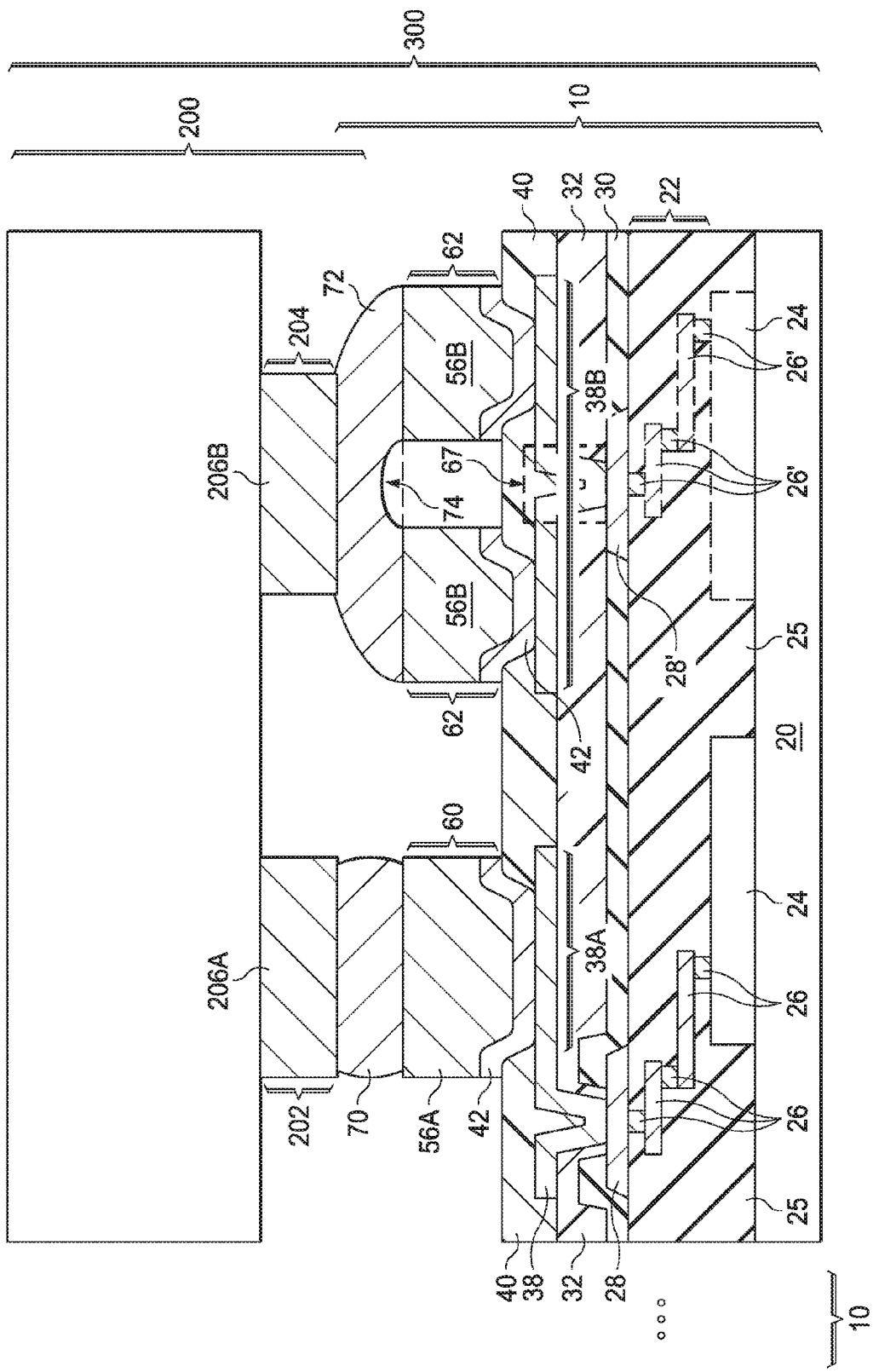
FIGS. 8A, 8B, and 8C illustrate the cross-sectional views of bonded package components in accordance with some embodiments.
Figure 8B:
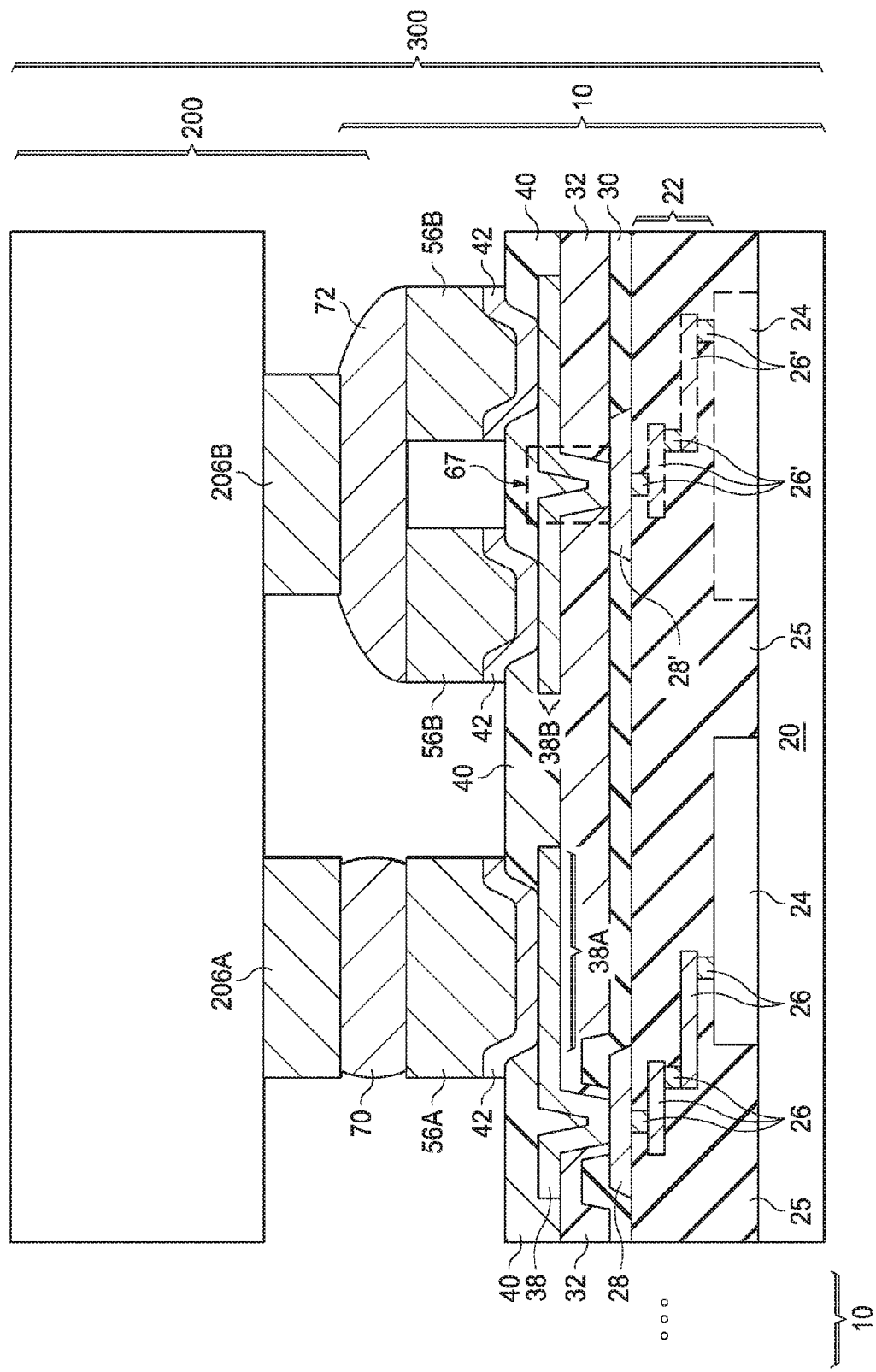
Figure 8C:
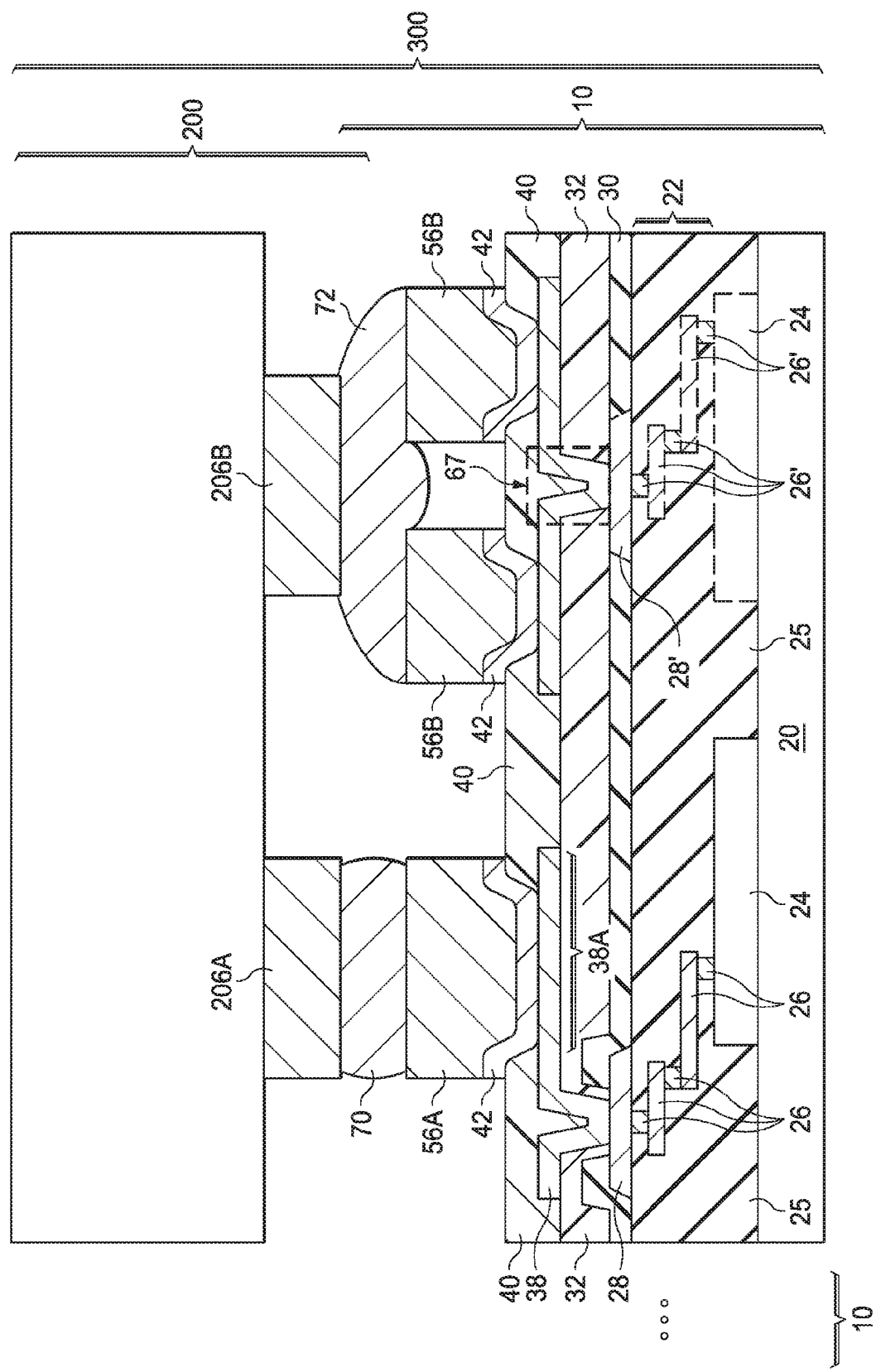

FIGS. 8A, 8B, and 8C illustrate the resulting package 300 after a reflow is performed to join die 10 and package component 200. Solder layers 58A and 206A (FIG. 7) are reflowed to form solder joint region 70 (FIGS. 8A, 8B, and 8C). Electrical connectors 60 and 202 are hence bonded to, and are electrically connected to, each other. Alignment bump 62 and bump 204 (FIG. 7) are joined, with solder layers 58B and 206B (FIG. 7) being reflowed to form solder joint region 72.

FIGS. 8A, 8B, and 8C illustrate some possible shapes of solder region 72. In FIG. 8A, void 74 is formed in solder region 72, wherein void 74 extends from the top surface of copper bump 56B up into solder joint region 72. Solder joint region 72 thus includes portions encircling void 74.

In FIG. 8B, the portion of solder joint region 72 directly over opening 68 has a bottom surface substantially level with the top surface of copper bump 56B. In FIG. 8C, a bottom portion of solder joint region 72 extends into opening 68, wherein the bottom portion may have a rounded bottom surface. It is appreciated that the shapes of solder joint regions 72 depend partially on the amount of solder, with less solder more likely to result in the shape in FIG. 8A, and more solder more likely to result in the shape in FIG. 8C. In a same package 300, there may exist only one type, two types, or all three type of the solder shapes as shown in FIGS. 8A, 8B, and 8C.

As also shown in FIGS. 8A, 8B, and 8C, alignment bump 62 may also be electrically connected to semiconductor devices 24, for example, through a via (marked in dashed box 67), metal pad 28', metal lines and vias 26', and the like.

Figure 9:
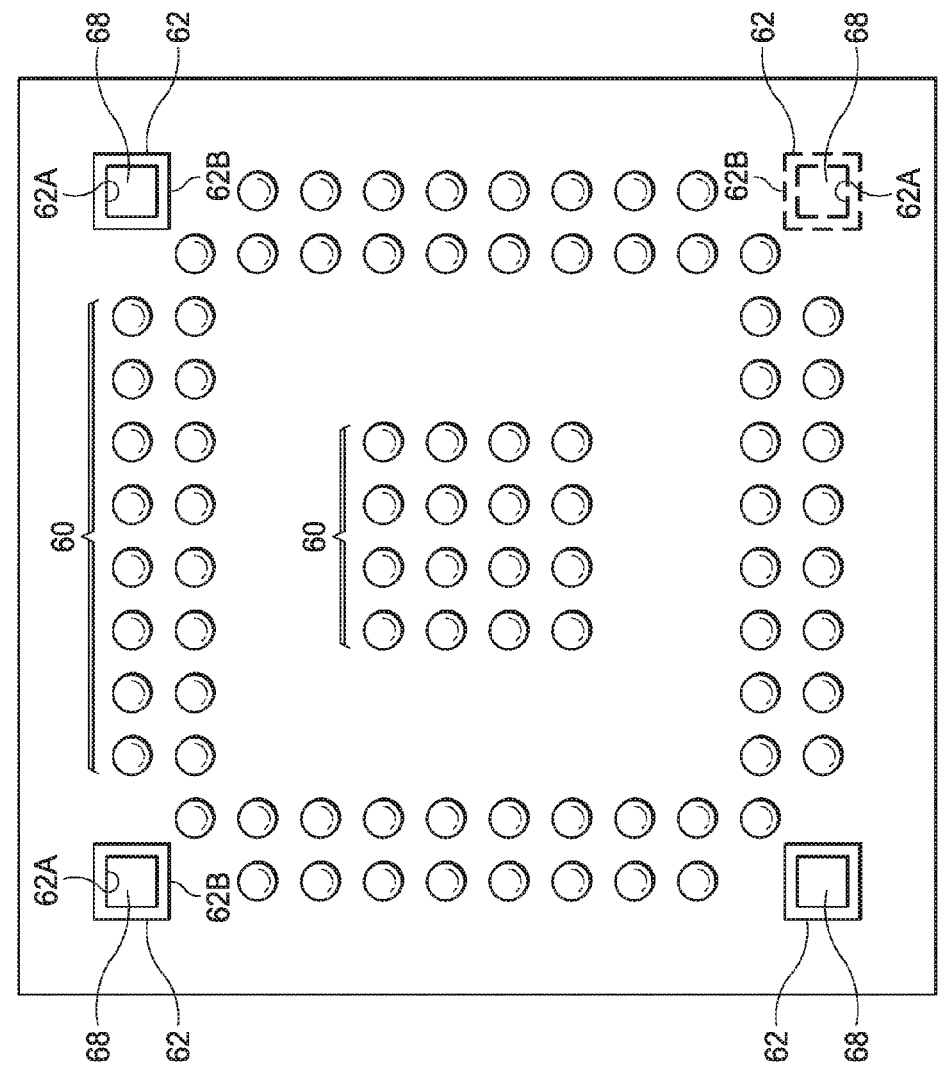
FIG. 9 illustrates a top view of a package component in accordance with some alternative embodiments, wherein alignment bumps have rectangular top-view shapes.

It is appreciated that each of the inner sidewall and the outer sidewall of alignment bump 62 may have various top-view shapes, including, and not limited to, circles, rectangles, hexagons, octagons, or other applicable shapes. For example, FIG. 9 illustrates the top view of die 10 in accordance with alternative embodiments. In these embodiments, the inner sidewalls 62A and the outer sidewalls 62B of alignment bumps 62 have square shapes.

Figure 10A:
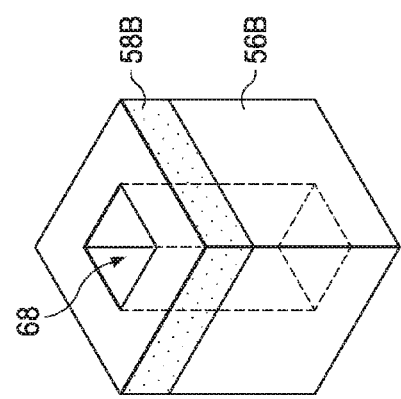
FIGS. 10A through 10D illustrate the perspective views of some alignment bumps.
Figure 10B:
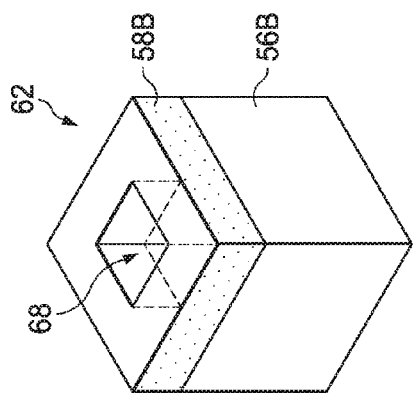
Figure 10C:
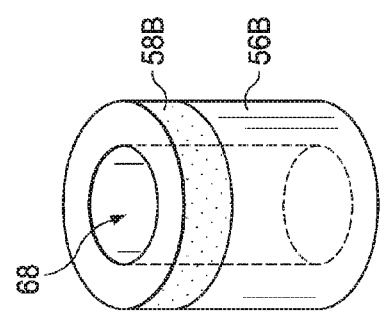
Figure 10D:
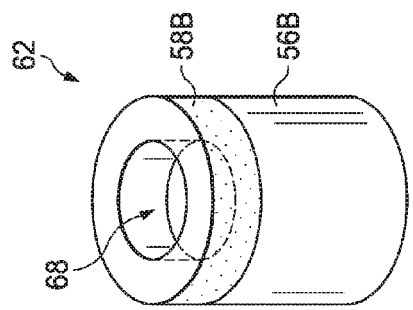

FIGS. 10A, 10B, 10C, and 10D illustrate the perspective view of some exemplary embodiments of alignment bumps 62 before they are reflowed. FIG. 10A illustrate that solder layer 58B and non-solder bump 56B both have rectangular-shaped inner sidewalls and outer sidewalls. Hence, opening 68 has the shape of a cube. In FIG. 10B, opening 68 does not extend into non-solder bump 56B. FIG. 10C illustrate that solder layer 58B and non-solder bump 56B both have circular shaped inner sidewalls and outer sidewalls. Hence, opening 68 has the shape of a cylinder. In FIG. 10D, opening 68 does not extend into non-solder bump 56B.

FIG. 11 illustrates the top view of die 10 in accordance with yet alternative embodiments. In these embodiments, in one or more of the corners of die 10, more than one alignment bumps 62 are formed.

Figure 12:
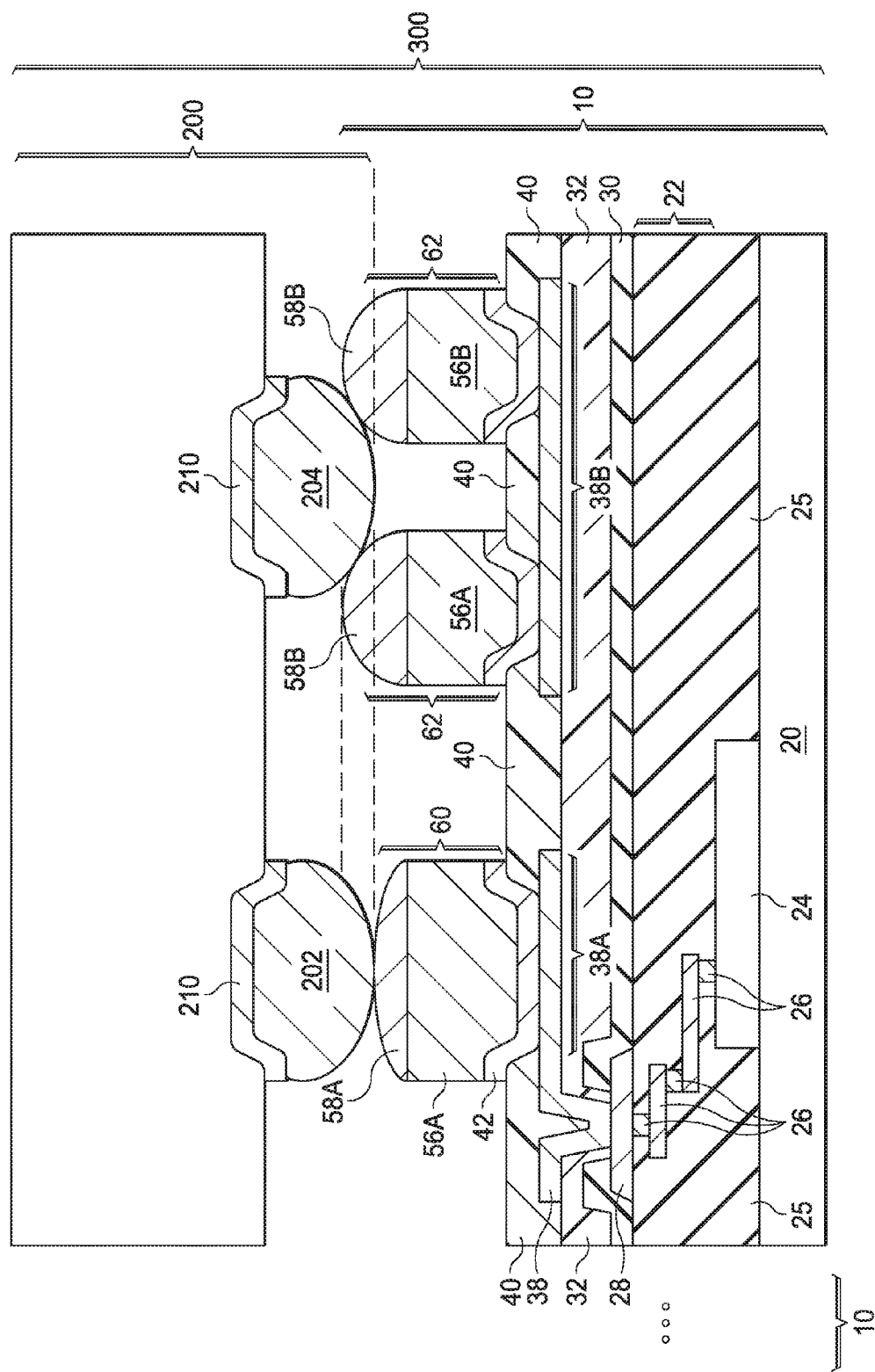
FIGS. 12 and 13 illustrate the cross-sectional view in the bonding of two package components in accordance with alternative embodiments.
Figure 13:
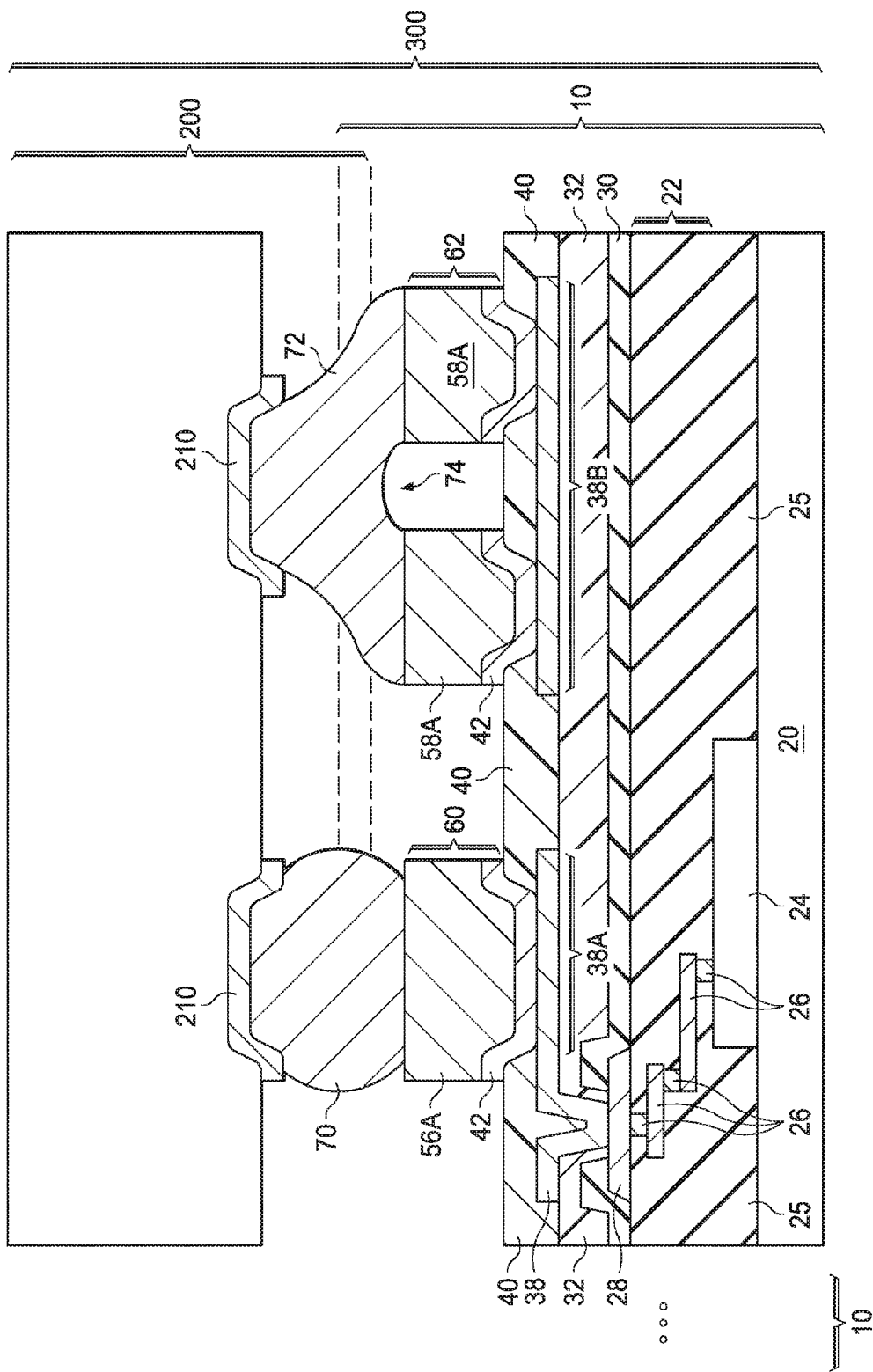

The alignment bumps 62 in accordance with the embodiments of the present disclosure may be used for the shift-prevention when the electrical connectors that are bonded to die 10 have other structures other than illustrated in FIGS. 7 through 8C. For example, In FIG. 12, electrical connector 202 and bump 204 are solder balls, which may be attached to UBMs 210. As shown in FIG. 12, when package component 200 is placed over die 10, alignment bump 62 may still perform the shift-prevention function and the alignment function. FIG. 13 illustrates a corresponding structure after an alignment is performed on the structure shown in FIG. 12. In these embodiments, solder region 72 may still have the similar structures as shown in FIGS. 8A, 8B, and 8C. For example, FIG. 13 illustrates that solder region 72 has the similar structure as shown in FIG. 8A, with void 74 extending into solder region 72.

The embodiments of the present disclosure have some advantageous features. By forming alignment bumps for stacking dies, alignment bumps may prevent the undesirable shifting of the overlying dies relative to the underlying dies. The formation of the alignment bumps may be performed simultaneously as the active bumps, and hence no extra cost is needed.

In accordance with some embodiments of the present disclosure, an integrated circuit structure includes an alignment bump and an active electrical connector. The alignment bump includes a first non-solder metallic bump. The first non-solder metallic bump forms a ring encircling an opening therein. The active electrical connector includes a second non-solder metallic bump. A surface of the first non-solder metallic bump and a surface of the second non-solder metallic bump are substantially coplanar with each other.

In accordance with alternative embodiments of the present disclosure, an integrated circuit structure includes a first package component and a second package component. The first package component includes an alignment bump at a surface of the first package component, wherein the alignment bump forms a ring encircling an opening therein. The alignment bump includes a first non-solder metallic bump. The first package component further includes a first electrical connector, wherein the first electrical connector has a solid shape with no opening therein, and wherein the first electrical connector includes a second non-solder metallic bump. A first solder region contacts the first non-solder metallic bump. A second solder region contacts the second non-solder metallic bump. The second package component includes a second electrical connector bonded to the first electrical connector through the first solder region, and a metal bump bonded to the alignment bump through the second solder region.

In accordance with yet alternative embodiments of the present disclosure, a method includes forming UBM layer, forming a first non-solder metallic bump over the UBM layer, wherein the first non-solder metallic bump is a solid bump, and forming a second non-solder metallic bump over the UBM layer, wherein the second non-solder metallic bump forms a ring with an opening therein. The method further includes forming a first solder layer overlapping the first non-solder metallic bump, and forming a second solder layer overlapping the second non-solder metallic bump, wherein the second solder layer encircles the opening. The portions of the UBM layer that are misaligned with the first non-solder metallic bump and the second non-solder metallic bump are removed. The first solder layer and the second solder layer are reflowed to form a first solder region and a second solder region, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming an Under-Bump Metallurgy (UBM) layer;
forming a first non-solder metallic bump over the UBM layer, wherein the first non-solder metallic bump is a solid bump;
forming a second non-solder metallic bump over the UBM layer, wherein the second non-solder metallic bump forms a ring with an opening therein;
forming a first solder region overlapping the first non-solder metallic bump;
forming a second solder region overlapping the second non-solder metallic bump, wherein the second solder region encircles the opening;
removing portions of the UBM layer misaligned from the first non-solder metallic bump and the second non-solder metallic bump; and
reflowing the first solder region and the second solder region to form a third solder region and a fourth solder region, respectively.

2. The method of claim 1, wherein the first non-solder metallic bump, the second non-solder metallic bump, the first solder region, and the second solder region are formed using a same mask layer.

3. The method of claim 1, wherein the third solder region has a first rounded top surface, the fourth solder region has a second rounded top surface, and wherein the first rounded top surface has a first top end lower than a second top end of the second rounded top surface.

4. The method of claim 1 further comprising:
placing a second package component, wherein a first electrical connector of the second package component is placed overlying and in contact with the third solder region, and a bump of the second package component is placed aligning to the opening, wherein a bottom part of the bump extends into the opening.

5. The method of claim 1, wherein the first non-solder metallic bump is electrically coupled to an active device, and the second non-solder metallic bump is a dummy bump.

6. The method of claim 1, wherein after the removing the portions of the UBM layer, the second non-solder metallic bump is not connected to any underlying metallic material.

7. The method of claim 1, wherein the second non-solder metallic bump is electrically connected to active devices underlying the second non-solder metallic bump.

8. A method comprising:
sawing a wafer into a plurality of chips, with a chip in the plurality of chips comprising an alignment bump, and the alignment bump comprising:

a first portion; and
a second portion over the first portion, wherein both the first portion and the second portion have ring shapes, with an opening encircled by the alignment bump;
placing a package component to be aligned to the chip, wherein a metal bump of the package component is aligned to the opening, and is in contact with the second portion of the alignment bump; and
performing a reflow to bond the package component to the chip.

9. The method of claim 8 further comprising forming the alignment bump at a top surface of the wafer, wherein the forming the alignment bump comprises plating.

10. The method of claim 8, wherein in the reflow, the first portion of the alignment bump is not molten, and the second portion of the alignment bump is reflowed to join to the metal bump of the package component.

11. The method of claim 8, wherein at a time the reflow starts, a bottom end portion of the metal bump of the package component extends into a portion of the opening, with a bottom end of the metal bump being below a top surface of the second portion of the alignment bump.

12. The method of claim 8, wherein after the reflow, the opening remains un-occupied.

13. The method of claim 8, wherein after the reflow, the second portion of the alignment bump forms at least a portion of a solder region, and wherein the solder region comprises:
a ring portion, with a void extending from a bottom surface of the first portion of the alignment bump into the ring portion; and
a top portion over the ring portion, wherein the top portion is connected to the ring portion.

14. The method of claim 8, wherein after the reflow, the second portion of the alignment bump forms at least a portion of a solder region, and wherein a portion of the solder region that overlaps the opening has a bottom surface substantially level with a top surface of the first portion of the alignment bump.

15. The method of claim 8, wherein after the reflow, the second portion of the alignment bump forms at least a portion of a solder region, and wherein a portion of the solder region extends to a level lower than a top surface of the first portion of the alignment bump, and wherein a bottom surface of the solder region that is exposed to the opening has a rounded bottom surface.

16. A method comprising:
forming an alignment bump at a top surface of a first package component, the alignment bump comprising:
a non-solder metallic bump; and
a solder region over the non-solder metallic bump, wherein the solder region forms a ring encircling an opening, and the solder region has a top surface;
placing a second package component to be aligned to the first package component, wherein a metal bump of the second package component is aligned to the opening, and a bottom portion of the metal bump extends into the opening; and
performing a reflow to bond the second package component to the first package component.

17. The method of claim 16, wherein the forming the alignment bump comprises:
plating the non-solder metallic bump on a metal layer;
plating the solder region over the non-solder metallic bump; and
reflowing the solder region.

18. The method of claim 16, wherein the alignment bump is electrically floating.

19. The method of claim 18, wherein an entirety of the alignment bump is over a polymer layer.

20. The method of claim 16 further comprising, when the second package component is bonded to the first package component, bonding a metal bump of the first package component to the second package component, wherein the metal bump is connected to active devices in the first package component.

* * * * *